(12) United States Patent
Chung et al.

(10) Patent No.: US 12,025,680 B2
(45) Date of Patent: Jul. 2, 2024

(54) METHOD AND MONITORING DEVICE USING THE SAME FOR ESTIMATING INTRINSIC PARAMETERS OF ENCAPSULATED CAPACITOR

(71) Applicant: City University of Hong Kong, Hong Kong (HK)

(72) Inventors: Shu Hung Henry Chung, Hong Kong (HK); Wai Kwan Lee, Hong Kong (HK)

(73) Assignee: City University of Hong Kong, Hong Kong (HK)

( * ) Notice: Subject to any disclaimer, the term of this patent is extended or adjusted under 35 U.S.C. 154(b) by 204 days.

(21) Appl. No.: 17/527,163

(22) Filed: Nov. 16, 2021

(65) Prior Publication Data

US 2023/0152391 A1 May 18, 2023

(51) Int. Cl.
*G01R 31/64* (2020.01)
*G01R 27/26* (2006.01)

(52) U.S. Cl.
CPC .......... *G01R 31/64* (2020.01); *G01R 27/2605* (2013.01)

(58) Field of Classification Search
CPC ....... G01R 31/64; G01R 15/16; G01R 31/016
See application file for complete search history.

(56) References Cited

U.S. PATENT DOCUMENTS

| 8,912,801 | B2 | 12/2014 | Gajic et al. |
| 9,318,944 | B2 | 4/2016 | Royak et al. |
| 9,389,263 | B2 * | 7/2016 | Sartler ............... G01R 19/0084 |
| 9,667,128 | B2 | 5/2017 | Patel et al. |

OTHER PUBLICATIONS

Chi-Jui Wu, Jung-Chen Chiang, Shih-Song Yen, Ching-Jung Liao, Jin-Shyr Yang and Tzong-Yih Guo, "Investigation and mitigation of harmonic amplification problems caused by single-tuned filters" in IEEE Transactions on Power Delivery, vol. 13, No. 3, pp. 800-806, Jul. 1998, doi: 10.1109/61.686977.

(Continued)

*Primary Examiner* — Son T Le
*Assistant Examiner* — Brian Butler Geiss
(74) *Attorney, Agent, or Firm* — Idea Intellectual Limited; Margaret A. Burke; Sam T. Yip

(57) ABSTRACT

A method for estimating intrinsic parameters of an encapsulated capacitor having three capacitors is provided, comprising: inputting received first sampled current value, second sampled current value and third sampled current value, first sampled voltage value, second sampled voltage value, and third sampled voltage value corresponding to the three capacitors into a capacitor current estimating model to obtain a first capacitor current error corresponding to a first capacitor among the three capacitors, a second capacitor current error corresponding to a second capacitor among the three capacitors and a third capacitor current error corresponding to a third capacitor among the three capacitors; and inputting the first capacitor current error, the second capacitor current error and the third capacitor current error into a particle swarm optimization model to obtain a plurality of optimized parameters corresponding to the three capacitors as a plurality of intrinsic parameters of the encapsulated capacitor.

9 Claims, 6 Drawing Sheets

(56) References Cited

OTHER PUBLICATIONS

D. Zhou, H. Wang, and F. Blaabjerg, "Reactive Power Impacts on LCL Filter Capacitor Lifetime in Grid-Connected Inverter" in IEEE Open Journal of Power Electronics, vol. 1, pp. 139-148, 2020, doi: 10.1109/OJPEL.2020.2992279.

G. M. Buiatti, J. A. Martin-Ramos, A. M. R. Amaral, P. Dworakowski and A. J. M. Cardoso, "Condition Monitoring of Metallized Polypropylene Film Capacitors in Railway Power Trains" in IEEE Transactions on Instrumentation and Measurement, vol. 58, No. 10, pp. 3796-3805, Oct. 2009, doi: 10.1109/TIM.2009.2019719.

S. C. Athikessavan, S. K. Panda, S. Nadarajan and A. K. Gupta, "Diagnosis and Prognosis of LCL Filter in Marine Electric Propulsion Systems" 2019 IEEE 13th International Conference on Power Electronics and Drive Systems (PEDS), 2019, pp. 1-5, doi: 10.1109/PEDS44367.2019.8998852.

L. Sainz, J. Pedra and S. Herraiz, "Capacitor and shunt filter unbalance influence on the electric system harmonic response" in IEEE Transactions on Power Delivery, vol. 20, No. 2, pp. 1522-1531, Apr. 2005, doi: 10.1109/TPWRD.2004.838630.

R. M. Tallam, R. J. Kerkman and R. A. Lukaszewski, "Detection of Capacitor Degradation in LC Filters for AC Drives" in IEEE Transactions on Industry Applications, vol. 51, No. 5, pp. 3822-3828, Sep.-Oct. 2015, doi: 10.1109/TIA.2015.2414394.

H. Jouybari-Moghaddam, T. S. Sidhu, M. R. Dadash Zadeh and P. P. Parikh, "Shunt Capacitor Banks Online Monitoring Using a Superimposed Reactance Method" in IEEE Transactions on Smart Grid, vol. 9, No. 6, pp. 5554-5563, Nov. 2018, doi: 10.1109/TSG.2017.2690643.

Z. Zhan, J. Zhang, Y. Li, and H. Chung, "Adaptive Particle Swarm Optimization" IEEE Transactions on Systems, Man, and Cybernetics: Part B: Cybernetics, vol. 39, No. 6, pp. 1362-1381, Dec. 2009.

W. Wang, H. Shu-Hung Chung and J. Zhang, "Near-Real-Time Parameter Estimation of an Electrical Battery Model With Multiple Time Constants and SOC-Dependent Capacitance" in IEEE Transactions on Power Electronics, vol. 29, No. 11, pp. 5905-5920, Nov. 2014.

Z. Zhan, J. Zhang, Y. Li and Y. Shi, "Orthogonal Learning Particle Swarm Optimization" in IEEE Transactions on Evolutionary Computation, vol. 15, No. 6, pp. 832-847, Dec. 2011.

Y. del Valle, G. K. Venayagamoorthy, S. Mohagheghi, J. Hernandez and R. G. Harley, "Particle Swarm Optimization: Basic Concepts, Variants and Applications in Power Systems" in IEEE Transactions on Evolutionary Computation, vol. 12, No. 2, pp. 171-195, Apr. 2008.

J. C. Bansal, P. K. Singh, M. Saraswat, A. Verma, S. S. Jadon and A. Abraham, "Inertia Weight strategies in Particle Swarm Optimization" 2011 Third World Congress on Nature and Biologically Inspired Computing, Salamanca, Spain, 2011.

C. Cheng, R. W. Lau, N. K. Rathi and H. S. Chung, "Extraction of Intrinsic Parameters of Lead-Acid Batteries Using Energy Recycling Technique" in IEEE Transactions on Power Electronics, vol. 34, No. 5, pp. 4765-4779, May 2019.

\* cited by examiner

METHOD AND MONITORING DEVICE USING THE SAME FOR ESTIMATING INTRINSIC PARAMETERS OF ENCAPSULATED CAPACITOR

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention generally relates to the field of monitoring device, and in particular, to a method and monitoring device using the same for estimating intrinsic parameters of an encapsulated capacitor.

BACKGROUND OF THE INVENTION

Passive harmonic filters have been used extensively in the power electronic systems (PES) since they are simple in structure, economical, and efficient.

Single-tuned harmonic filter is constructed by connecting a reactor in series with several capacitors. The number of capacitors is used to adjust the resonant frequency of the filter. Since it is unable to filter out effectively all harmonics with single filter, the entire distribution network consists of multiple single-tuned filters. Due to possible load current unbalancing, different levels of capacitance reduction, and drift of the filter parameters, the currents flowing through the filter reactors and capacitors are unbalanced, causing unbalanced capacitor voltage distribution. Apart from increasing component stress, the filter capacitors will be heated up and might explode.

Currently, the staff on-site conducts on-site measurement regularly to observe the magnitude of the capacitor voltages manually. However, premature failure of the power components, such as filter capacitors, could not be detected easily and accurately. Therefore, there is a need for automatically monitoring values of unmeasurable intrinsic parameters of a plurality of the encapsulated capacitors of the harmonic filters, such that the abnormal components/capacitors can be detected earlier before the failures of the components/capacitors are occurred, and the safety of the whole power grid system and the efficiency of the maintenance would be increased.

SUMMARY OF THE INVENTION

In accordance to various embodiments of the present invention, a method, implementable by a processor of a monitoring device, for estimating intrinsic parameters of an encapsulated capacitor having three capacitors, wherein a first capacitor, a second capacitor and a third capacitor among the three capacitors are delta-connected, and every two of the three capacitors are electrically coupled via a first node, a second node and a third node respectively. The method includes: receiving, from a current signal conditioning circuit of the monitoring device, a first sampled current value corresponding to a first current inputted to the first node, a second sampled current value corresponding to a second current inputted to the second node, and a third sampled current value corresponding to a third current inputted to the third node; receiving, form a voltage signal conditioning circuit of the monitoring device, a first sampled voltage value corresponding to the first node and the second node, a second sampled voltage value corresponding to the second node and the third node, and a third sampled voltage value corresponding to the third node and the first node; inputting, by the processor, the first sampled current value, the second sampled current value and the third sampled current value, the first sampled voltage value, the second sampled voltage value, and the third sampled voltage value into a capacitor current estimating (CCE) model to obtain a first capacitor current error corresponding to a first capacitor among the three capacitors, a second capacitor current error corresponding to a second capacitor among the three capacitors and a third capacitor current error corresponding to a third capacitor among the three capacitors; and inputting, by the processor, the first capacitor current error, the second capacitor current error and the third capacitor current error into a particle swarm optimization (PSO) model to obtain a plurality of optimized parameters corresponding to the three capacitors as a plurality of intrinsic parameters of the encapsulated capacitor.

BRIEF DESCRIPTION OF THE DRAWINGS

Embodiments of the invention are described in more details hereinafter with reference to the drawings, in which.

DETAILED DESCRIPTION

In the following description, a method and a monitoring device using the same for estimating intrinsic parameters of three capacitors of an encapsulated capacitor and the likes are set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Figure 1A:
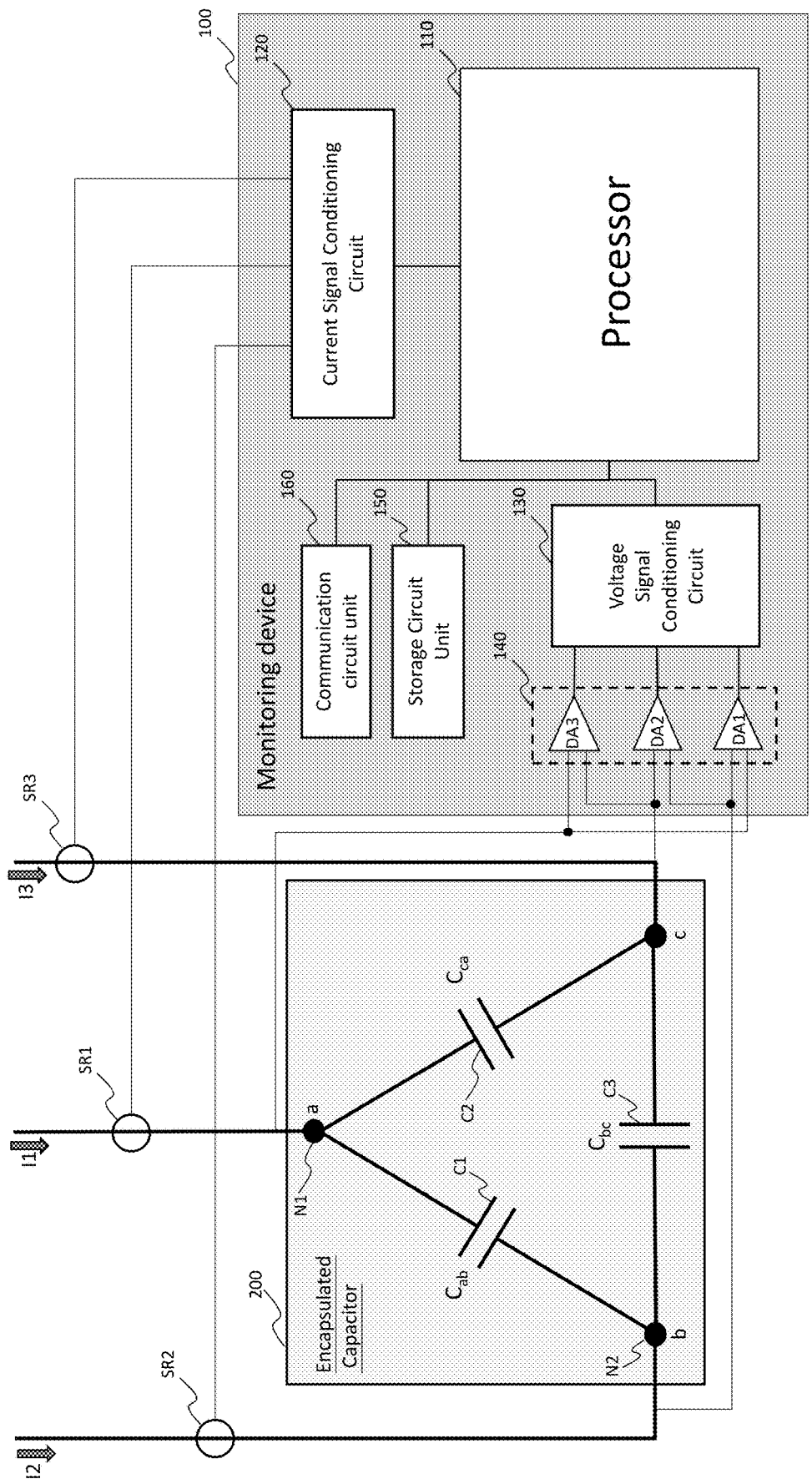
FIG. 1A depicts a block diagram illustrating a monitoring device and an encapsulated capacitor in accordance with one embodiment of the present invention.
Figure 1B:
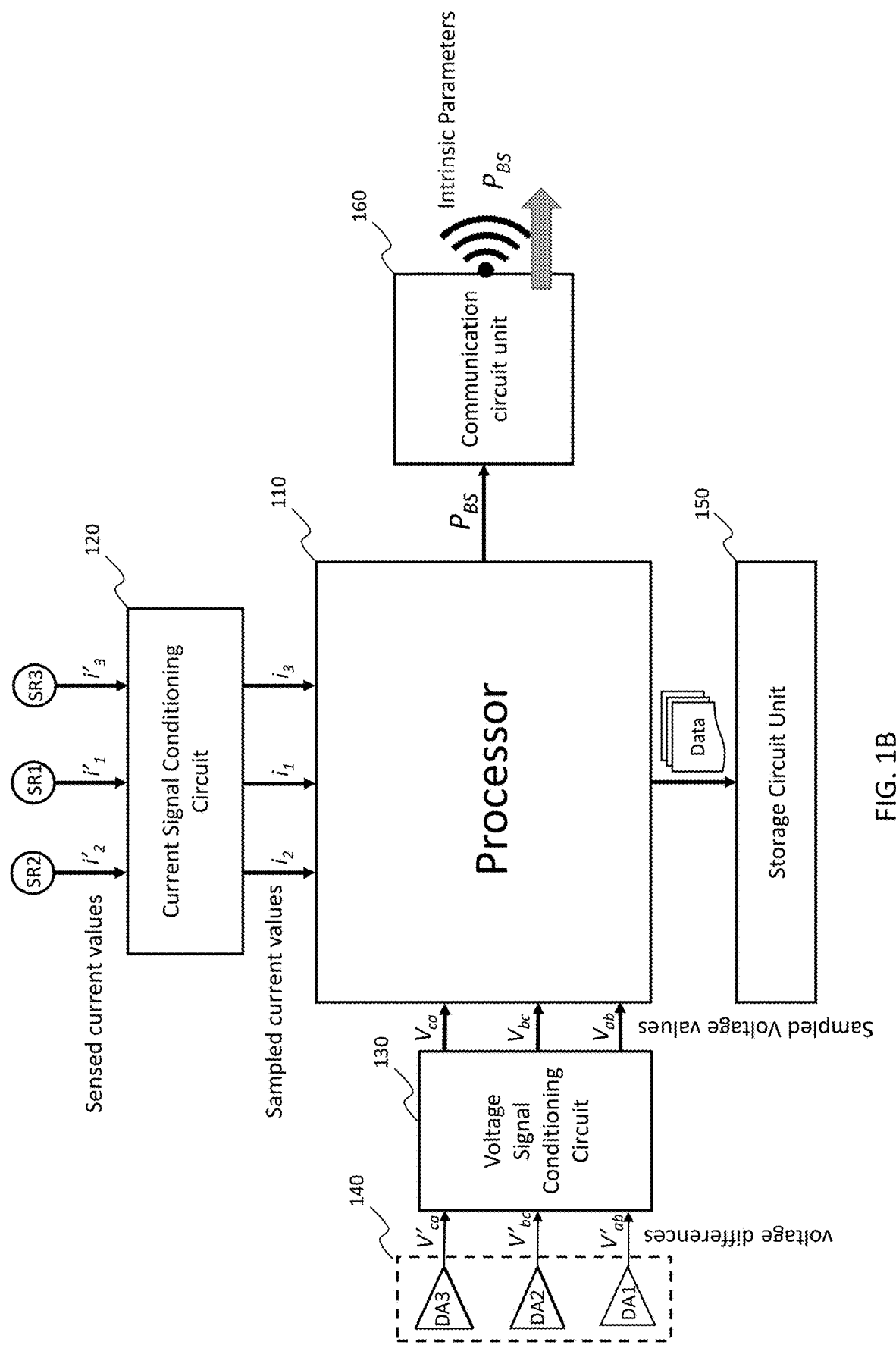
FIG. 1B depicts a schematic diagram illustrating signal/data flows between the components of the monitoring device in accordance with one embodiment of the present invention.

FIG. 1A depicts a block diagram illustrating a monitoring device and an encapsulated capacitor in accordance with one embodiment of the present invention. FIG. 1B depicts a schematic diagram illustrating signal/data flows between the components of the monitoring device in accordance with one embodiment of the present invention. Referring to FIG. 1, in accordance to various embodiments of the present invention, a monitoring device 100 includes a processor 110, a current signal conditioning circuit, a voltage signal conditioning circuit 130, a plurality of differential amplifiers 140, a storage circuit unit 150 and a communication circuit unit 160. In the embodiment, an encapsulated capacitor 200 includes a first capacitor C1, a second capacitor C2 and a third capacitor C3, wherein the three capacitors C1, C2 and C3 are electrically coupled, as illustrated in FIG. 1A, in a manner of delta-connected via three nodes (i.e., a first node N1, a second node N2 and a third node N3) in between. Furthermore, currents (i.e., a first current I1, a second current I2 and a third current I3) of power provided to the encapsulated capacitor 200 are inputted respectively through the nodes N1 to N3. In an embodiment, the inputted currents are provided by a harmonic filter inductor (not shown) of a power system.

In the embodiment, the current values of the inputted currents are sensed respectively by current sensors (e.g., a first current sensor SR1, a second current sensor SR2 and a third current sensor SR3), and the current signal conditioning circuit 120 is electrically coupled to the current sensors SR1 to SR3.

Referring to FIG. 1B, the first current sensor SR1, the second current sensor SR2 and the third current sensor SR3 respectively generate and send a first sensed current value $i'_1$, a second sensed current value $i'_2$ and a third sensed current value $i'_3$ to the current signal conditioning circuit 120 continuously. The current signal conditioning circuit 120 is configured to generate and send a first sampled current value $i_1$, a second sampled current value $i_2$ and a third sampled current value $i_3$ by sampling the first sensed current value $i'_1$, a second sensed current value $i'_2$ and a third sampling current value $i'_3$ respectively to the processor 110. In the embodiment, the current signal conditioning circuit 120 includes at least an analog-to-digital converter.

Referring to FIG. 1A, the differential amplifiers 140 includes a first differential amplifier DA1, a second differential amplifier DA2 and a third differential amplifier DA3, wherein the first differential amplifier DA1 is electrically coupled to the first node N1 and the second node N2, the second differential amplifier DA2 is electrically coupled to the second node N2 and the third node N3, and the third differential amplifier DA3 is electrically coupled to the third node N3 and the first node N1. In one embodiment, the differential amplifiers DA1 to DA3 are electrically coupled to the nodes through corresponding voltage sensors (not shown in the figures).

Referring to FIG. 1B, the first voltage difference V'ab between the first node N1 and the second node N2 is generated and outputted to the voltage signal conditioning circuit 130 by the first differential amplifier DA1, the second voltage difference $V'_{bc}$ between the second node N2 and the third node N3 is generated and outputted to the voltage signal conditioning circuit 130 by the first differential amplifier DA2, the third voltage difference $V'_{ca}$ between the third node N3 and the first node N1 is generated and outputted to the voltage signal conditioning circuit 130 by the third differential amplifier DA3.

Furthermore, the voltage signal conditioning circuit 130 generates and sends the first sampled voltage value $V_{ab}$, the second sampled voltage value $V_{bc}$ and the third sampled voltage value $V_{ca}$ by respectively sampling a first voltage difference $V'_{ab}$, a second voltage difference $V'_{bc}$ and a third voltage difference $V'_{ca}$. In the embodiment, the voltage signal conditioning circuit 130 includes at least an analog-to-digital converter.

In the embodiment, the storage circuit unit 150 may store data received from the processor 110, wherein the data includes, for example, the sampled voltage values $V_{ab}$, $V_{bc}$ and $V_{ca}$, the sampled current values $i_1$, $i_2$ and $i_3$, the result of the intrinsic parameters $P_{BS}$, the results of calculations performed by the capacitor current estimating (CCE) model and particle swarm optimization (PSO) model. Furthermore, the storage circuit unit 150 may store firmware and program code modules (e.g., CCE model and PSO model) for implementing the provided method.

In the embodiment, the storage circuit unit 150 may be any type of hard disk drive (HDD), non-volatile memory storage device (e.g., solid state drive, SSD), or DRAM.

The communication circuit unit 160 is configured to establish a network for connecting to other electronic devices or internet/cloud-server, and send, by the instruction from the processor 110, data (e.g., the intrinsic parameters of a particular encapsulated capacitor) to the connected devices or internet/cloud-server, such that after receiving the intrinsic parameters, the corresponding backend device/server may proceed related management or maintenance. In the embodiment, the communication circuit unit 160 has a wireless communication circuit module.

The processor 110 is configured to control the current signal conditioning circuit 120, the voltage signal conditioning circuit 130, the storage circuit unit 150 and the communication circuit unit 160.

In the embodiment, the processor 110 is a hardware with computing capability, and is used to manage the overall operation of the device to which the processor belongs (e.g., monitoring device 100). In the embodiment, the processor is, for example, a central processing unit (CPU) with one core or multiple cores, a micro-control-unit (MCU), or other similar devices.

Figure 2:
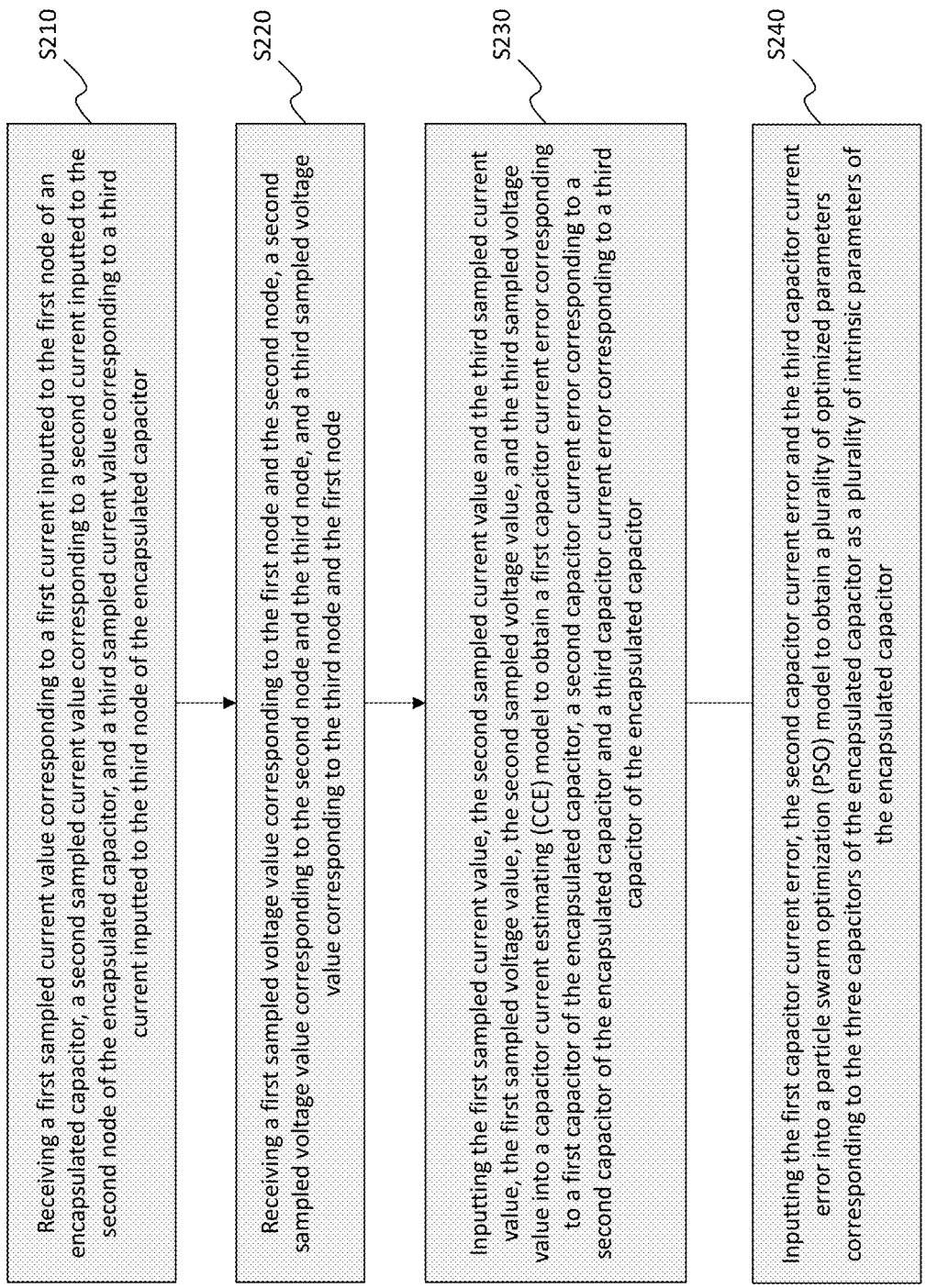
FIG. 2 depicts a flowchart of a method implemented by the monitoring device in accordance with one embodiment of the present invention.

FIG. 2 depicts a flowchart of a method implemented by the monitoring device in accordance with one embodiment of the present invention. Referring to FIG. 2, in step S210, the processor 110 receives a first sampled current value $i_1$ corresponding to a first current $I_1$ inputted to the first node N1 of an encapsulated capacitor 200, a second sampled current value $i_2$ corresponding to a second current $I_2$ inputted to the second node N2 of the encapsulated capacitor 200, and a third sampled current value $i_3$ corresponding to a third current $I_3$ inputted to the third node N3 of the encapsulated capacitor 200. Next, in step S220, the processor 110 receives a first sampled voltage value $V_{ab}$ corresponding to the first node N1 and the second node N2, a second sampled voltage value $V_{bc}$ corresponding to the second node N2 and the third node N3, and a third sampled voltage value $V_{ca}$ corresponding to the third node N3 and the first node N1.

Next, in step S230, the processor 110 inputs the first sampled current value $i_1$, the second sampled current value $i_2$ and the third sampled current value $i_3$, the first sampled voltage value $V_{ab}$, the second sampled voltage value $V_{bc}$, and the third sampled voltage value $V_{ca}$ into a capacitor current estimating (CCE) model to obtain a first capacitor current error $i_{ab,e}$ corresponding to a first capacitor C1 of the encapsulated capacitor 200, a second capacitor current error $i_{bc,e}$ corresponding to a second capacitor C2 of the encapsulated capacitor 200 and a third capacitor current error $i_{ca,e}$ corresponding to a third capacitor C3 of the encapsulated capacitor 200.

Figure 3:
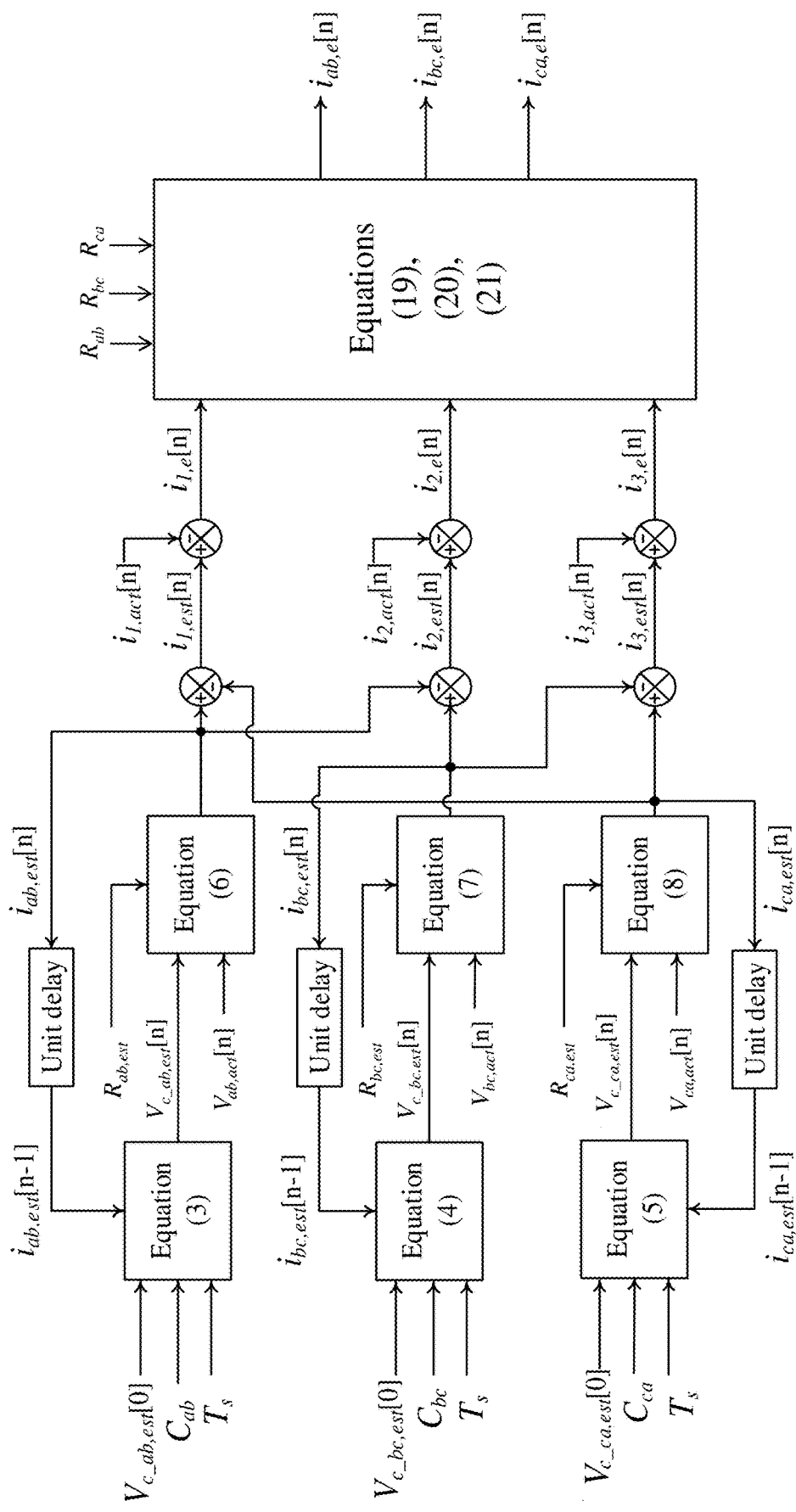
FIG. 3 depicts a schematic diagram of a capacitor current estimating (CCE) model executed by a processor of the monitoring device in accordance with one embodiment of the present invention.

FIG. 3 depicts a schematic diagram of a capacitor current estimating (CCE) model executed by a processor of the monitoring device in accordance with one embodiment of the present invention. In principle, capacitances $C_{ab}$, $C_{bc}$, and $C_{ca}$ of capacitors C1 to C3 can be determined by using their associated voltages (i.e., $V_{ab}$, $V_{bc}$, and $V_{ca}$) and currents (i.e., $i_{ab}$, $i_{bc}$, and $i_{ca}$). Practically, voltages $V_{ab}$, $V_{bc}$, and $V_{ca}$ can be measured by voltage sensors. However, currents $i_{ab}$, $i_{bc}$, and $i_{ca}$ are unmeasurable because the capacitors are encapsulated. Instead, only inputted currents $I_1$, $I_2$, and $I_3$ can be measured, but currents $i_{ab}$, $i_{bc}$, and $i_{ca}$ cannot be obtained from inputted currents $I_1$, $I_2$, and $I_3$. Mathematically, matrix A in equation (1) below is non-invertible, due to the unknown loop current in the circuit of the delta-connected capacitors.

$$\begin{bmatrix} i_1 \\ i_2 \\ i_3 \end{bmatrix} = A \begin{bmatrix} i_{ab} \\ i_{bc} \\ i_{ca} \end{bmatrix} \quad (1)$$

$$\text{where } A = \begin{bmatrix} 1 & 0 & -1 \\ -1 & 1 & 0 \\ 0 & -1 & 1 \end{bmatrix}.$$

The relation between the voltages $V_{ab}$, $V_{bc}$, and $V_{ca}$ can be expressed by equation (2).

$$V_{ab} + V_{bc} + V_{ca} = 0 \quad (2)$$

In the following embodiments, the term "[n]" indicates the corresponding value is related to n-th sample of the sampled current value or the sampled voltage value.

Referring to FIG. 3, The n-th sample of a first estimated capacitor voltage $V_{c\_ab,est}$, a second estimated capacitor voltage $V_{c\_bc,est}$, and a third estimated capacitor voltage $V_{c\_ca,est}$ can be expressed respectively by equations (3) to (5) below:

$$V_{c_{ab},est}[n] = V_{c_{ab},est}[0] + \frac{T_s}{C_{ab}} \sum_{k=0}^{n-1} i_{ab,est}[k] \quad (3)$$

$$V_{c_{bc},est}[n] = V_{c_{bc},est}[0] + \frac{T_s}{C_{bc}} \sum_{k=0}^{n-1} i_{bc,est}[k] \quad (4)$$

$$V_{c_{ca},est}[n] = V_{c_{ca},est}[0] + \frac{T_s}{C_{ca}} \sum_{k=0}^{n-1} i_{ca,est}[k] \quad (5)$$

Where $V_{c\_ab,est}[0]$, $V_{c\_bc,est}[0]$, and $V_{c\_ca,est}[0]$ are initial estimated voltages on capacitors C1, C2, and C3 respectively, in the considered time series, $T_s$ is the sampling period, and $i_{ab,est}[k]$, $i_{bc,est}[k]$, and $i_{ca,est}[k]$ are the estimated capacitor currents of k-th sample of $i_{ab}$, $i_{bc}$, and $i_{ca}$ respectively.

In other words, the first estimated capacitor voltage $V_{c\_ab,est}$ is calculated according to a first initial estimated capacitor voltage $V_{c\_ab,est}[0]$ corresponding to the first capacitor C1, a value of a sampling period $T_s$, a first capacitance value $C_{ab}$ of the first capacitor C1, and one or more recorded first estimated capacitor currents $i_{ab,est}[k]$ during the sampling period $T_s$; the second estimated capacitor voltage $V_{c\_bc,est}$ is calculated according to a second initial estimated capacitor voltage $V_{c\_bc,est}[0]$ corresponding to the second capacitor C2, the value of the sampling period $T_s$, a second capacitance value $C_{bc}$ of the second capacitor C2, and one or more recorded second estimated capacitor currents ($i_{bc,est}[k]$) during the sampling period $T_s$; the third estimated capacitor voltage ($V_{c\_ca,est}$) is calculated according to a third initial estimated capacitor voltage ($V_{c\_ca,est}[0]$) corresponding to the third capacitor C3, the value of the sampling period $T_s$, a third capacitance value $C_{ca}$ of the third capacitor C3, and one or more recorded third estimated capacitor currents ($i_{ca,est}[k]$) during the sampling period $T_s$.

Then, estimated capacitor currents $i_{ab,est}[n]$, $i_{bc,est}[n]$ and $i_{ca,est}[n]$ are calculated by the actual values of voltages of capacitors $V_{ab,act}[n]$, $V_{bc,act}[n]$ and $V_{ca,act}[n]$ (i.e., the sampled voltage values $V_{ab}$, $V_{bc}$, $V_{ca}$) respectively according to equations (6) to (8) below.

$$i_{ab,est}[n] = \frac{V_{ab,act}[n] - V_{c_{ab},est}[n]}{R_{ab_j est}} \quad (6)$$

$$i_{bc,est}[n] = \frac{V_{bc,act}[n] - V_{c_{bc},est}[n]}{R_{bc_j est}} \quad (7)$$

$$i_{ca,est}[n] = \frac{V_{ca,act}[n] - V_{c_{ca},est}[n]}{R_{ca,est}} \quad (8)$$

Where $R_{ab,est}$, $R_{bc,est}$ and $R_{ca,est}$ are estimated equivalent series resistance (ESR) of capacitors $C_{ab}$, $C_{bc}$, and $C_{ca}$ respectively. In other words, the first estimated capacitor current $i_{ab,est}$ is calculated according to the first sampled voltage value $V_{ab,act}$, a first estimated capacitor voltage $V_{c\_ab,est}$ corresponding to the first capacitor $C_{ab}$, and a first estimated ESR $R_{ab,est}$ corresponding to the first capacitor $C_{ab}$; the second estimated capacitor current $i_{bc,est}$ is calculated according to the second sampled voltage value $V_{bc,act}$, a second estimated capacitor voltage $V_{c\_bc,est}$ corresponding to the second capacitor$_{bc}$, and a second estimated ESR $R_{bc,est}$ corresponding to the second capacitor $C_{bc}$; and the third estimated capacitor current $i_{ca,est}$, is calculated according to the third sampled voltage value $V_{ca,act}$, a third estimated capacitor voltage $V_{c\_ca,est}$ corresponding to the third capacitor $C_{ca}$, and a third estimated ESR $R_{ca,est}$ corresponding to the third capacitor $C_{ca}$.

Thus, based on equation (1), the estimated current values $i_{1,est}$, $i_{2,est}$ and $i_{3,est}$ are calculated by equations (9) to (11) below.

$$i_{1,est}[n] = i_{ab,est}[n] - i_{ca,est}[n] \quad (9)$$

$$i_{2,est}[n] = i_{bc,est}[n] - i_{ab,est}[n] \quad (10)$$

$$i_{3,est}[n] = i_{ca,est}[n] - i_{bc,est}[n] \quad (11)$$

Then, based on equation (2), equation (12) is obtained.

$$R_{ab}i_{ab} + R_{bc}i_{bc} + R_{ca}i_{ca} + (V_{c_{ab}} + V_{c_{bc}} + V_{c_{ca}}) = 0 \quad (12)$$

Thus, by using equations (1) and (12), the capacitor currents $i_{ab}[n]$, $i_{bc}[n]$ and $i_{ca}[n]$ can be expressed as, in terms of the sampled current values $i_1[n]$, $i_2[n]$, and $i_3[n]$, capacitors voltages $V_{c\_ab}[n]$, $V_{c\_bc}[n]$ and $V_{c\_ca}[n]$, and ESRs $R_{ab}$, $R_{bc}$ and $R_{ca}$ of the capacitors via equations (13) to (15) below.

$$i_{ab}[n] = \frac{-(V_{c_{ab}}[n] + V_{c_{bc}}[n] + V_{c_{ca}}[n]) - R_{ab}i_1[n] - R_{bc}(i_1[n] + i_2[n])}{(R_{ab} + R_{bc} + R_{ca})} + i_1[n] \quad \text{Equation (13)}$$

$$i_{bc}[n] = \frac{-(V_{c_{ab}}[n] + V_{c_{bc}}[n] + V_{c_{ca}}[n]) - R_{ab}i_1[n] - R_{bc}(i_1[n] + i_2[n])}{(R_{ab} + R_{bc} + R_{ca})} - i_3[n] \quad \text{Equation (14)}$$

$$i_{ca}[n] = \frac{-(V_{c_{ab}}[n] + V_{c_{bc}}[n] + V_{c_{ca}}[n]) - R_{ab}i_1[n] - R_{bc}(i_1[n] + i_2[n])}{(R_{ab} + R_{bc} + R_{ca})} \quad \text{Equation (15)}$$

Three error functions (also called as current errors) $i_{1,e}$, $i_{2,e}$ and $i_{3,e}$ for comparing the estimated and actual values of the sampled current values are defined by equations (16) to (18) below.

$$i_{1,e}[n]=i_{1,est}[n]-i_{1,act}[n] \quad (16)$$

$$i_{2,e}[n]=i_{2,est}[n]-i_{2,act}[n] \quad (17)$$

$$i_{3,e}[n]=i_{3,est}[n]-i_{3,act}[n] \quad (18)$$

Based on (13)-(18), the errors of the estimated capacitor currents $i_{ab,est}[n]$, $i_{bc,est}[n]$ and $i_{ca,est}[n]$ in (6)-(8) can be expressed by equations (19) to (21) below.

$$i_{ab,e}[n] = i_{ab,est}[n] - i_{ab,act}[n] = \frac{R_{ca}i_{1,e}[n] - R_{bc}i_{2,e}[n]}{R_{ab} + R_{bc} + R_{ca}} \quad (19)$$

$$i_{bc,e}[n] = i_{bc,est}[n]i_{bc,act}[n] = \frac{R_{ab}i_{2,e}[n] - R_{ca}i_{3,e}[n]}{R_{ab} + R_{bc} + R_{ca}} \quad (20)$$

$$i_{ca,e}[n] = i_{ca,est}[n]i_{ca,act}[n] = \frac{-R_{ab}i_{1,e}[n] + R_{bc}i_{3,e}[n]}{R_{ab} + R_{bc} + R_{ca}} \quad (21)$$

Where $i_{ab,act}$, $i_{bc,act}$, $i_{ca,act}$ are the actual capacitor currents of capacitors $C_{ab}$, $C_{bc}$, and $C_{ca}$ respectively.

In the embodiment, a PSO-based engine is provided to estimate system parameters, including capacitances $C_{ab}$, $C_{ab}$ and $C_{ca}$, their ESRs $R_{ab}$, $R_{bc}$ and $R_{ca}$, and their initial capacitor voltages, $V_{c\_ab}[0]$, $V_{c\_bc}[0]$ and $V_{c\_ca}[0]$ by using a population of particles to minimize the mean square error (MSE) of $i_{ab,e}$, $i_{bc,e}$ and $i_{ca,e}$ which are outputted by the CCE model. Each particle P is a vector, expressed by equation (22) below, that consists of the above parameters (candidates of the intrinsic parameters).

$$P=[C_{ab}C_{bc}C_{ca}R_{ab}R_{bc}R_{ca}V_{c_{ca}}[0]V_{c_{bc}}[0]V_{c_{ca}}[0]] \quad \text{Equation (22)}$$

The particles will be controlled to move in the search space and search for the global best solution to satisfy an objective function. The velocity (variation vector) of each of the particles moving towards the best solution together with other particles is adjusted. The provided m-PSO (i.e., the PSO model) is an enhanced PSO engine that has a random perturbation introduced for searching solution within the operation boundaries. Traditional PSO does not have reference to adjust the moving trajectory of the particles, and the solution of traditional PSO might trap into a local optimum. Random perturbations are introduced into the solution at each iteration to improve the fitness of the best particle and help the swarm jump out of the local optimum, thereby enhancing the accuracy of the solution and convergence speed.

Figure 4A:
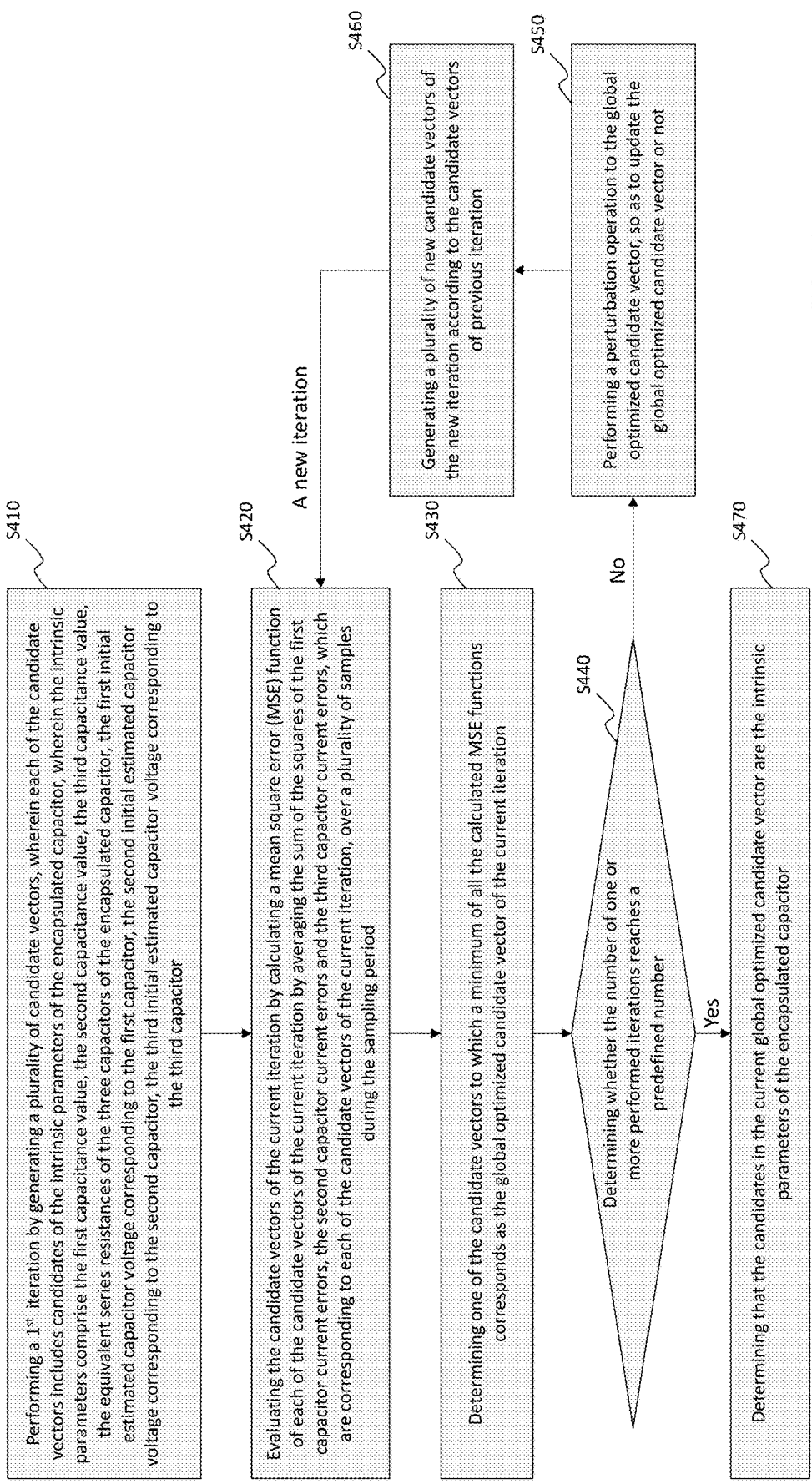
FIG. 4A depicts a flowchart of operations of a particle swarm optimization (PSO) model executed by the processor of the monitoring device in accordance with one embodiment of the present invention.

FIG. 4A depicts a flowchart of operations of a particle swarm optimization (PSO) model executed by the processor of the monitoring device in accordance with one embodiment of the present invention. Referring to FIG. 4A, in step S410, the processor 110 (or the PSO model) performs a 1st iteration by generating a plurality of candidate vectors (e.g., vectors of the particles), wherein each of the candidate vectors includes candidates of the intrinsic parameters of the encapsulated capacitor 200, wherein the intrinsic parameters comprise the first capacitance value $C_{ab}$, the second capacitance value $C_{bc}$, the third capacitance value $C_{ca}$, the equivalent series resistances $R_{ab}$, $R_{bc}$ and $R_{ca}$ of the three capacitors C1 to C3 of the encapsulated capacitor 200, the first initial estimated capacitor voltage $V_{c\_ab}[0]$ corresponding to the first capacitor C1, the second initial estimated capacitor voltage $V_{c\_bc}[0]$ corresponding to the second capacitor C2, the third initial estimated capacitor voltage $V_{c\_ca}[0]$ corresponding to the third capacitor C3.

Next, in step S420, the processor 110 (or the PSO model) evaluates the candidate vectors of the current iteration by calculating a mean square error (MSE) function of each of the candidate vectors of the current iteration by averaging the sum of the squares of the first capacitor current errors $i_{ab,e}$, the second capacitor current errors $i_{bc,e}$ and the third capacitor current errors $i_{ca,e}$, which are corresponding to each of the candidate vectors of the current iteration, over a plurality of samples during the sampling period $T_s$.

More specifically, the MSE function of each of the particles can be expressed via equation (23) below.

$$MSE(P) = \frac{1}{N}\sum_{k=1}^{N}\left(i_{ab,e}[n]^2 + i_{bc,e}[n]^2 + i_{ca,e}[n]^2 + i_{ca,e}[n]^2\right) \quad (23)$$

Where N is the total number of the samples.

In the embodiment, the best set of parameters (best candidates in the global optimized candidate vector), $P_{BS}$, in (22), gives the minimum value of MSE(P), and thus, $P_{BS}$ can be expressed by equation (24) below.

$$P_{BS} = \arg\min_{P} MSE(P) \quad (24)$$

Next, in step S430, the processor 110 (or the PSO model) determines one of the candidate vectors to which a minimum of all the calculated MSE functions corresponds as the global optimized candidate vector $P_G$ (e.g., PBS is the final result of the $P_G$ after performed all the iterations) of the current iteration.

Next, in step S440, the processor 110 (or the PSO model) determines whether the number of one or more performed iterations reaches a predefined number. In other words, the processor 110 (or the PSO model) may determine whether the iterations should be finished according to the predetermined number.

In response to determining that the number of one or more performed iterations does not reach the predefined number (e.g., the total number of the iterations is not enough), proceeding to step S450, the processor 110 (or the PSO model) performs a perturbation operation to the global optimized candidate vector, so as to update the global optimized candidate vector or not.

Next, in step S460, the processor 110 (or the PSO model) generates a plurality of new candidate vectors of the new iteration according to the candidate vectors of previous iteration. Specifically, step S460 includes: calculating a variation vector, which is used for generating the new candidate vectors of the new iteration, of each of the candidate vectors of previous iteration according to a learning factor, two weighting factors, a corresponding candidate vector of previous iteration, a corresponding local optimized candidate vector and the global optimized candidate vector; and generating the new candidate vectors of the new iteration by respectively adding the corresponding variation vectors to the candidate vectors of previous iteration.

In more detail, let n be the population size—the number of candidate vectors for the optimal solution of the intrinsic parameters and G be the total number (e.g., the predefined number) of optimization cycles (iterations, or generations) in the entire optimization process. Apart from the parameters, the i-th candidate vector $P_i$ has also included a velocity for updating its parameters.

In the embodiment, for g-th iteration (new iteration), the velocity $v_i^{(g)}$ (also called as variation vector) corresponding to each i-th candidate vector (particle) can be expressed by equation (25) below.

$$v_i^{(g)} = w^{(g-1)}v_i^{(g-1)} + r_{1,i}^{(g-1)}[P_G^{(g-1)} - P_i^{(g-1)}] + r_{2,i}^{(g-1)}[P_{H,i}^{(g-1)} - P_i^{(g-1)}] \quad \text{Equation (25)}$$

Where $v_i^{(g-1)}$ is the velocity in the (g−1)-th iteration; $P_G$ is the globally-optimized particle in the whole performed iterations; $P_i^{(g-1)}$ is the i-th particle in the (g−1)-th generation; $P_{H,i}^{(g-1)}$ is a local optimized particle corresponding to i-th particle among all i-th particles in the performed $1^{st}$ to (g−1)-th generations; $w^{(g-1)} \in (0, 1)$ is the learning factor; and $r_{1,i}^{(g-1)}$ and $r_{2,i}^{(g-1)}$ initialized randomly, are weighting factors evenly distributed between 0 and 1. w is calculated by a sigmoid decreasing inertia weight for controlling the exploration and exploitation abilities of the swarm and for eliminating the need for velocity clamping, and w can be expressed by equation (26) below.

$$w = \frac{1}{1 + 1.5e^{-2.6f}} \quad (26)$$

Where $$f = \frac{D_G - D_{min}}{D_{max} - D_{min}}.$$

Distance is a vector difference (or position difference) between particle in previous iteration and new particle in the new iteration. $D_G$ is distance corresponding to the global best particle. $D_{min}$, and $D_{max}$ are minimum distance and maximum distance respectively in population, total number of particles.

The local optimized particle $P_{H,i}^{(g-1)}$ can be determined by equation (27) below.

$$P_{H,i}^{(g-1)} = \begin{cases} P_i^{(g-1)} & \text{for } MSE(P_i^{(g-1)}) < MSE(P_{H,i}^{(g-2)}) \\ P_{H,i}^{(g-2)} & \text{for } MSE(P_i^{(g-1)}) \geq MSE(P_{H,i}^{(g-2)}) \end{cases} \quad (27)$$

And, $P_G^{(g-1)}$ is calculated by considering the MSE of all local optimized particles of (g−1)-th iteration, as expressed by equation (28) below.

$$P_G^{(g-1)} = \arg\min_{P_{H,i}^{(g-1)}} MSE(P_{H,i}^{(g-1)}) \quad (28)$$

Then, a new i-th particle (candidate vector) can be updated by (29) below.

$$P_i^{(g)} = P_i^{(g-1)} + v_i^{(g)} \quad (29)$$

It should be noted that if the new value of a parameter is outside the boundary, the velocity of the corresponding particle will be updated by reversing the order to make the parameter fall within the search boundary.

After all the particles are updated for new iteration, the processor 110 (or the PSO model) may proceed step S420 again for performing the new iteration process by evaluating all the new updated candidate vectors.

Back to step S440, in response to determining that the number of one or more performed iterations reaches a predefined number (e.g., the processor 110 determines that the iterations should be finished), in step S470, the processor 110 (or the PSO model) determines that the candidates in the current global optimized candidate vector are the intrinsic parameters of the encapsulated capacitor 200.

In the embodiment, to avoid the solution trapping into local optimum, the found global optimized candidate vector set is perturbed randomly to generate other possible solutions. The detail would be explained with FIG. 4B below.

Figure 4B:
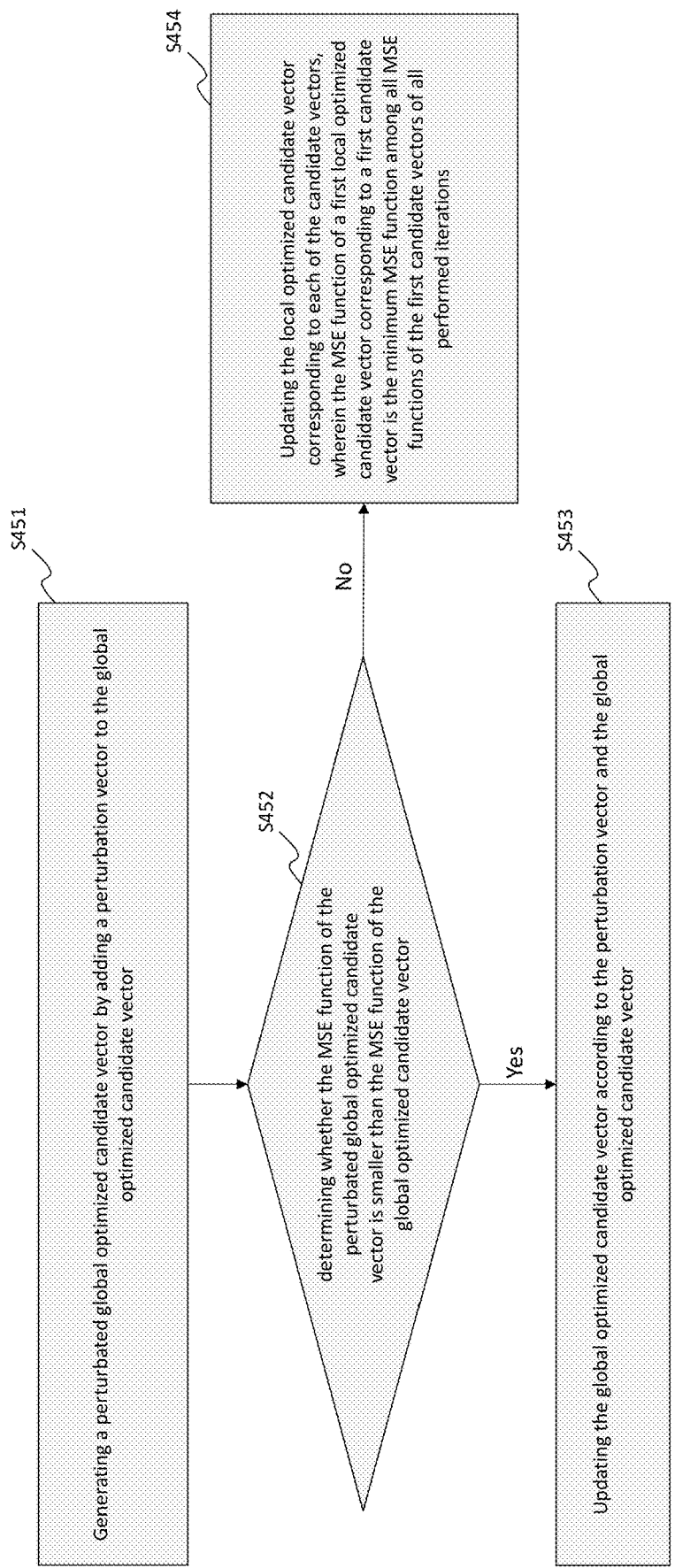
FIG. 4B depicts a flowchart of step S450 in FIG. 4A in accordance with one embodiment of the present invention.

FIG. 4B depicts a flowchart of step S450 in FIG. 4A in accordance with one embodiment of the present invention. Referring to FIG. 4B, in step 451, the processor 110 (or the PSO model) generates a perturbated global optimized candidate vector by adding a perturbation vector to the global optimized candidate vector.

Specifically, A perturbated global optimized candidate vector $\tilde{P}_B^{(g)}$ is firstly generated by adding a perturbation vector $\delta_p^{(g)}$ into the globally optimized candidate vector $P_G^{(g)}$ before P is updated with (29). Thus, perturbated global optimized candidate vector $\tilde{P}_B^{(g)}$ can be expressed by equation (30) below.

$$\tilde{P}_B^{(g)} = P_G^{(g)} + \delta_p^{(g)} \quad (30)$$

And, $\delta_p^{(g)}$ for the m-th parameter is expressed by equation (31) below.

$$\delta_p^{(g)}(m) = (X_m^{Max} - X_m^{Min}) * \text{Normal}(0, 0.8) \quad (31)$$

Where Normal(0, 0.8) is a random number in a normal distribution with a zero mean and variance of 0.8. $X_m^{Max}$ and $X_m^{Min}$ are the upper and lower boundary of parameter m, respectively. Normal distribution with higher variance results in a wider spread of random initial values within the searching boundaries.

The perturbation operation generates possible solutions that are located out of the globally best solution, thereby avoiding the solution trapping into local optima.

Furthermore, the MSE functions of $\tilde{P}_B^{(g)}$ and $P_G^{(g)}$ are then computed by using equation (23). Next, in step S452, the processor 110 (or the PSO model) determines whether the MSE function of the perturbated global optimized candidate vector is smaller than the MSE function of the global optimized candidate vector.

In response to determining that the MSE function of the perturbated global optimized candidate vector is smaller than the MSE function of the global optimized candidate vector, in step S453, the processor 110 (or the PSO model) updates the global optimized candidate vector according to the perturbation vector and the global optimized candidate vector.

Specifically, when MSE ($\tilde{P}_B^{(g)}$) < MSE ($P_G^{(g)}$), the global optimized candidate vector $P_G^{(g)}$ will be replaced by the best one (having smaller result of MSE) in the set {$P_G^{(g)} + \delta_p^{(g)}$, $P_G^{(g)} + 2\delta_p^{(g)}$, $P_G^{(g)} + 4\delta_p^{(g)}$, ..., $P_G^{(g)} + 2^j\delta_p^{(g)}$}, where $P_G^{(g)} + 2^j\delta_p^{(g)}$ is within the search boundaries and $P_G^{(g)} + 2^{j+1}\delta_p^{(g)}$ is outside the boundaries. In other words, the global optimized candidate vector $P_G^{(g)}$ can be updated by equation (32) below.

$$P_G^{(g)} = \arg\min_p MSE(p), \text{ subject to: } p = P_G^{(g)} + 2^r\delta p^{(g)} \quad (32)$$

Where r=0, 1, 2, ..., j.

In response to determining that the MSE function of the perturbated global optimized candidate vector is not smaller than the MSE function of the global optimized candidate vector, in step S454, the processor 110 (or the PSO model)

updates the local optimized candidate vector $P_{H,i}^{(g-1)}$ corresponding to each of the i-th candidate vectors, wherein the MSE function of a first local optimized candidate vector corresponding to a first candidate vector is the minimum MSE function among all MSE functions of the first candidate vectors of all performed iterations.

The functional units of the apparatuses and the methods in accordance to embodiments disclosed herein may be implemented using computing devices, computer processors, or electronic circuitries including but not limited to application specific integrated circuits (ASIC), field programmable gate arrays (FPGA), and other programmable logic devices configured or programmed according to the teachings of the present disclosure. Computer instructions or software codes running in the computing devices, computer processors, or programmable logic devices can readily be prepared by practitioners skilled in the software or electronic art based on the teachings of the present disclosure.

All or portions of the methods in accordance to the embodiments may be executed in one or more computing devices including server computers, personal computers, laptop computers, mobile computing devices such as smartphones and tablet computers.

The embodiments include computer storage media having computer instructions or software codes stored therein which can be used to program computers or microprocessors to perform any of the processes of the present invention. The storage media can include, but are not limited to, floppy disks, optical discs, Blu-ray Disc, DVD, CD-ROMs, and magneto-optical disks, ROMs, RAMs, flash memory devices, or any type of media or devices suitable for storing instructions, codes, and/or data.

Each of the functional units in accordance to various embodiments also may be implemented in distributed computing environments and/or Cloud computing environments, wherein the whole or portions of machine instructions are executed in distributed fashion by one or more processing devices interconnected by a communication network, such as an intranet, Wide Area Network (WAN), Local Area Network (LAN), the Internet, and other forms of data transmission medium.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

What is claimed is:

1. A maintenance method for an encapsulated capacitor by detecting if the capacitor is abnormal by estimating intrinsic parameters of the encapsulated capacitors from measured input currents and input voltages, the encapsulated capacitor having three capacitors, wherein a first capacitor, a second capacitor and a third capacitor among the three capacitors are delta-connected, and every two of the three capacitors are electrically coupled via a first node, a second node and a third node respectively, the maintenance method comprising:

coupling a monitoring device to the encapsulated capacitor having the three capacitors, the monitoring device including a voltage signal conditioning circuit, a current signal conditioning circuit and a processor, the voltage signal conditioning circuit being coupled to the first, second, and third nodes through first, second, and third differential amplifiers and the current conditioning circuit coupled to the first, second, and third nodes through first, second, and third current sensors;

the monitoring device receiving, from the current signal conditioning circuit of the monitoring device, a first sampled current value corresponding to a first current inputted to the first node, a second sampled current value corresponding to a second current inputted to the second node, and a third sampled current value corresponding to a third current inputted to the third node;

receiving, from a voltage signal conditioning circuit of the monitoring device, a first sampled voltage value corresponding to the first node and the second node, a second sampled voltage value corresponding to the second node and the third node, and a third sampled voltage value corresponding to the third node and the first node;

inputting, by the processor, the first sampled current value, the second sampled current value and the third sampled current value, the first sampled voltage value, the second sampled voltage value, and the third sampled voltage value into a capacitor current estimating (CCE) model to obtain a first capacitor current error corresponding to a first capacitor among the three capacitors, a second capacitor current error corresponding to a second capacitor among the three capacitors and a third capacitor current error corresponding to a third capacitor among the three capacitors;

inputting, by the processor, the first capacitor current error, the second capacitor current error and the third capacitor current error into a particle swarm optimization (PSO) model to obtain a plurality of optimized parameters corresponding to the three capacitors as a plurality of intrinsic parameters of the encapsulated capacitor; and determining if the first, second, or third capacitors are abnormal based on the intrinsic parameters of the encapsulated capacitor.

2. The method as recited in claim 1, wherein the first sampled voltage value, the second sampled voltage value and the third sampled voltage value are generated by sampling a first voltage difference, a second voltage difference and a third voltage difference respectively via the voltage signal conditioning circuit electrically coupled to the processor, wherein the first voltage difference is outputted by a first differential amplifier electrically coupled to the first node and the second node, the second voltage difference is outputted by a second differential amplifier electrically coupled to the second node and the third node, and the third voltage difference is outputted by a third differential amplifier electrically coupled to the third node and the first node, wherein the first differential amplifier, second differential amplifier and third differential amplifier are further electrically coupled to the voltage signal conditioning circuit.

3. The method as recited in claim 2, wherein, by the CCE model, the first capacitor current error is calculated according to a first current error corresponding to the first node, a second current error corresponding to the second node, and three equivalent series resistances (ESRs) respectively corresponding to the first capacitor, the second capacitor and the third capacitor, the second capacitor current error is calculated according to a second current error corresponding to the second node, a third current error corresponding to the third node, and the ESRs, the third capacitor current error is calculated according to a third current error corresponding to the third node, the first current error corresponding to the third node, and the ESRs, wherein the three ESRs comprises a first equivalent series resistance (ESR) corresponding to the first capacitor, a second ESR corresponding to the second capacitor and a third ESR corresponding to the third capacitor, wherein the first current error is calculated according to a first estimated current value corresponding to the first node and the first sampled current value, the second current error is calculated according to a second estimated current value corresponding to the second node and the second sampled current value, and the third current error is calculated according to a third estimated current value corresponding to the third node and the third sampled current value.

4. The method as recited in claim 3, wherein, by the CCE model, the first estimated current value is calculated according to a first estimated capacitor current corresponding to the first capacitor and a third estimated capacitor current corresponding to the third capacitor, the second estimated current value is calculated according to a second estimated capacitor current corresponding to the second capacitor and the first estimated capacitor current, the third estimated current value is calculated according to the third estimated capacitor current and the second estimated capacitor current.

5. The method as recited in claim 4, wherein, by the CCE model, the first estimated capacitor current is calculated according to the first sampled voltage value, a first estimated capacitor voltage corresponding to the first capacitor, and a first estimated ESR corresponding to the first capacitor, the second estimated capacitor current is calculated according to the second sampled voltage value, a second estimated capacitor voltage corresponding to the second capacitor, and a second estimated ESR corresponding to the second capacitor, the third estimated capacitor current is calculated according to the third sampled voltage value, a third estimated capacitor voltage corresponding to the third capacitor, and a third estimated ESR corresponding to the third capacitor.

6. The method as recited in claim 5, wherein, by the CCE model, the first estimated capacitor voltage is calculated according to a first initial estimated capacitor voltage corresponding to the first capacitor, a value of a sampling period, a first capacitance value of the first capacitor, and one or more recorded first estimated capacitor currents during the sampling period;

the second estimated capacitor voltage is calculated according to a second initial estimated capacitor voltage corresponding to the second capacitor, the value of the sampling period, a second capacitance value of the second capacitor, and one or more recorded second estimated capacitor currents during the sampling period, the third estimated capacitor voltage is calculated according to a third initial estimated capacitor voltage corresponding to the third capacitor, the value of the sampling period, a third capacitance value of the third capacitor, and one or more recorded third estimated capacitor currents during the sampling period.

7. The method as recited in claim 6, the step of inputting the first capacitor current error, the second capacitor current error and the third capacitor current error into the PSO model to obtain the plurality of optimized parameters comprising:

performing a 1st iteration by generating a plurality of candidate vectors, wherein each of the candidate vectors includes candidates of the intrinsic parameters of the encapsulated capacitor, wherein the intrinsic parameters comprise the first capacitance value, the second capacitance value, the third capacitance value, the ESRs, the first initial estimated capacitor voltage corresponding to the first capacitor, the second initial estimated capacitor voltage corresponding to the second capacitor, the third initial estimated capacitor voltage corresponding to the third capacitor;

evaluating the candidate vectors of the current iteration by calculating a mean square error (MSE) function of each of the candidate vectors of the current iteration by averaging the sum of the squares of the first capacitor current errors, the second capacitor current errors and the third capacitor current errors, which are corresponding to each of the candidate vectors of the current iteration, over a plurality of samples during the sampling period;

determining one of the candidate vectors to which a minimum of all the calculated MSE functions corresponds as the global optimized candidate vector of the current iteration;

determining whether the number of one or more performed iterations reaches a predefined number;

in response to determining that the number of the current iteration does not reach a predefined number, performing a perturbation operation to the global optimized candidate vector, so as to update the global optimized candidate vector or not; and performing a new iteration by generating a plurality of new candidate vectors of the new iteration according to the candidate vectors of previous iteration; and in response to determining that the number of the current iteration reaches the predefined number, determining that the candidates in the current global optimized candidate vector are the intrinsic parameters of the encapsulated capacitor.

8. The method as recited in claim 7, wherein the step of generating the new candidate vectors of the new iteration according to the candidate vectors of previous iteration comprises:

calculating a variation vector, which is used for generating the new candidate vectors of the new iteration, of each of the candidate vectors of previous iteration according to a learning factor, two weighting factors, a corresponding candidate vector of previous iteration, a corresponding local optimized candidate vector and the global optimized candidate vector; and generating the new candidate vectors of the new iteration by respectively adding the corresponding variation vectors to the candidate vectors of previous iteration.

9. The method as recited in claim 8, wherein the step of performing the perturbation operation to the global optimized candidate vector, so as to update the global optimized candidate vector or not comprises:
- generating a perturbated global optimized candidate vector by adding a perturbation vector to the global optimized candidate vector;
- determining whether the MSE function of the perturbated global optimized candidate vector is smaller than the MSE function of the global optimized candidate vector;
- in response to determining that the MSE function of the perturbated global optimized candidate vector is smaller than the MSE function of the global optimized candidate vector, updating the global optimized candidate vector according to the perturbation vector and the global optimized candidate vector; and
- in response to determining that the MSE function of the perturbated global optimized candidate vector is not smaller than the MSE function of the global optimized candidate vector, updating the local optimized candidate vector corresponding to each of the candidate vectors, wherein the MSE function of a first local optimized candidate vector corresponding to a first candidate vector is the minimum MSE function among all MSE functions of the first candidate vectors of all performed iterations.

* * * * *